(12) United States Patent
Wan

(10) Patent No.: US 10,771,018 B2
(45) Date of Patent: Sep. 8, 2020

(54) HARMONIC SUPPRESSION METHOD, CORRESPONDING LOW-NOISE AMPLIFIER, AND COMMUNICATION TERMINAL

(71) Applicant: VANCHIP (TIANJIN) TECHNOLOGY CO.,LTD., Tianjin (CN)

(72) Inventor: Wenhua Wan, Tianjin (CN)

(73) Assignee: VANCHIP (TIANJIN) TECHNOLOGY CO., LTD., Binhai New Area, Tianjin (CN)

( * ) Notice: Subject to any disclaimer, the term of this patent is extended or adjusted under 35 U.S.C. 154(b) by 0 days.

(21) Appl. No.: 16/314,369

(22) PCT Filed: Jun. 30, 2017

(86) PCT No.: PCT/CN2017/091332
§ 371 (c)(1),
(2) Date: Dec. 28, 2018

(87) PCT Pub. No.: WO2018/001376
PCT Pub. Date: Jan. 4, 2018

(65) Prior Publication Data
US 2019/0319588 A1    Oct. 17, 2019

(30) Foreign Application Priority Data
Jun. 30, 2016    (CN) .......................... 2016 1 0506970

(51) Int. Cl.
*H03F 1/26*    (2006.01)
*H03F 1/56*    (2006.01)
(Continued)

(52) U.S. Cl.
CPC .................. *H03F 1/26* (2013.01); *H03F 1/56* (2013.01); *H03F 3/193* (2013.01); *H03F 3/195* (2013.01);
(Continued)

(58) Field of Classification Search
CPC ........................................................ H03F 1/26
(Continued)

(56) References Cited

U.S. PATENT DOCUMENTS 6,057,737 A * 5/2000 Pritchard ................ H03F 1/306
330/300
7,443,236 B2  10/2008 Dow et al.
(Continued)

FOREIGN PATENT DOCUMENTS

CN    101167245 A    4/2008
CN    201918964 U    8/2011
(Continued)

OTHER PUBLICATIONS

International Search Report in the international application No. PCT/CN2017/091332, dated Oct. 13, 2017.
(Continued)

*Primary Examiner* — Patricia T Nguyen
(74) *Attorney, Agent, or Firm* — Ladas & Parry, LLP

(57) ABSTRACT

Provided is a harmonic suppression method, a corresponding low-noise amplifier (20, 30, 40), and a communication terminal. In the harmonic suppression method, an isolation unit (23, 33, 43) is arranged between a harmonic suppression unit (24, 34, 44) of the low-noise amplifier (20, 30, 40) and an output match network (25, 35, 45)/input match network (21, 31, 41). The harmonic suppression unit (24, 34, 44) is isolated from the output match network (25, 35, 45)/input match network (21, 31, 41) by means of the isolation unit (23, 33, 43), so that the two are not affected or compromised by each other, and can be designed separately. In this way, the design flexibility of a signal amplification circuit is greatly improved, and the design difficulty is reduced.

9 Claims, 5 Drawing Sheets

(51) Int. Cl.
  *H03F 3/193* (2006.01)
  *H03F 3/195* (2006.01)
  *H03F 3/21* (2006.01)

(52) U.S. Cl.
  CPC ......... *H03F 3/21* (2013.01); *H03F 2200/255* (2013.01); *H03F 2200/267* (2013.01); *H03F 2200/294* (2013.01); *H03F 2200/372* (2013.01); *H03F 2200/451* (2013.01)

(58) Field of Classification Search
  USPC .......................................................... 330/10
  See application file for complete search history.

(56) References Cited

U.S. PATENT DOCUMENTS

| | | | | |
|---|---|---|---|---|
| 2005/0227652 | A1* | 10/2005 | Kang | H04B 1/28 |
| | | | | 455/194.2 |
| 2008/0224770 | A1* | 9/2008 | Kim | H03F 3/68 |
| | | | | 330/51 |
| 2008/0242235 | A1* | 10/2008 | Adler | H04B 1/006 |
| | | | | 455/73 |
| 2010/0259331 | A1* | 10/2010 | Duster | H03F 1/0255 |
| | | | | 330/305 |
| 2010/0271122 | A1* | 10/2010 | Masuda | H03G 3/3052 |
| | | | | 330/144 |
| 2012/0268205 | A1 | 10/2012 | Presti | |
| 2014/0253242 | A1 | 9/2014 | Youssef et al. | |
| 2016/0056765 | A1* | 2/2016 | Kim | H03F 3/211 |
| | | | | 330/295 |
| 2018/0062690 | A1* | 3/2018 | Hageraats | H04B 1/40 |
| 2019/0372528 | A1* | 12/2019 | Pal | H03F 1/223 |

FOREIGN PATENT DOCUMENTS

| | | | |
|---|---|---|---|
| CN | 102332886 | A | 1/2012 |
| CN | 102355200 | A | 2/2012 |
| CN | 102396152 | A | 3/2012 |
| CN | 103532497 | A | 1/2014 |
| CN | 203466780 | U | 3/2014 |
| CN | 105515540 | A | 4/2016 |
| CN | 106160673 | A | 11/2016 |
| JP | 2011199338 | A * | 10/2011 |
| JP | 2011199338 | A | 10/2011 |
| KR | 20040091388 | A | 10/2004 |
| WO | 2014185436 | A1 | 11/2014 |

OTHER PUBLICATIONS

International Preliminary Report on Patentability dated Jan. 1, 2019 in international application No. PCT/CN2017/091332.
First Office Action in Chinese application No. 201610506970.8, dated Aug. 27, 2019.
Supplementary Search Report in the Chinese application No. 201610506970.8, dated Dec. 24, 2019.
Second Office Action in Chinese application No. 201610506970.8, dated Dec. 31, 2019.

* cited by examiner

HARMONIC SUPPRESSION METHOD, CORRESPONDING LOW-NOISE AMPLIFIER, AND COMMUNICATION TERMINAL

CROSS-REFERENCE TO RELATED APPLICATIONS

This application is the U.S. national phase of PCT Application No. PCT/CN2017/091332 filed on Jun. 30, 2017 which is based on and claims priority to Chinese Patent Application No. 201610506970.8, filed on Jun. 30, 2016, the disclosures of which are incorporated herein by reference in their entireties.

BACKGROUND

Technical Field

The present invention relates to a harmonic suppression method facing a low-noise amplifier, also relates to a low-noise amplifier using the harmonic suppression method and a corresponding communication terminal, and belongs to the field of integrated circuit technologies.

Related Art

A low-noise amplifier is an amplifier having a very low noise coefficient, has excellent characteristics such as a small size, a light weight, and low costs, and especially, has features of a low noise, a broad frequency band, and a high gain in terms of radio frequency characteristics. Currently, the low-noise amplifier is usually used as a high-frequency or intermediate-frequency preamplifier in various radio receivers, a signal amplification circuit in a high-sensitivity electronic detection device, and the like.

With continuous development of electronic product integrity and continuous decrease in power consumption, a feature size of an electronic component continuously decreases, a supply voltage continuously drops, a linear dynamic range thereof also shrinks as the voltage drops, and a requirement on harmonic suppression is increasingly high. In the prior art, a commonly used harmonic suppression means is inlaying a harmonic suppression unit in an output match network/input match network, and a harmonic suppression capability thereof and impedance matching are compromised by each other. In addition, this design manner increases design difficulty of a circuit and reduces flexibility of design.

Qualcomm Incorporated discloses a harmonic suppressor for use in a common-gate amplifier in a PCT application of International Application No. PCT/US2014/050719. In this patent application, a radio frequency signal received from a transmission line is provided to a source of a transistor in a common-gate amplification circuit. A series resonator connected to the source provides a low-impedance path connected to ground to an interfered radio frequency component in the radio frequency signal. The series resonator is tuned to provide a high impedance to a frequency band centered on an interested frequency and shunt the radio frequency component interfered outside the frequency band centered on the interested frequency. The interfered radio frequency component may include a harmonic of the interested frequency.

SUMMARY

A primary technical problem to be resolved by the present invention is to provide a harmonic suppression method facing a low-noise amplifier.

Another technical problem to be resolved by the present invention is to provide a low-noise amplifier using the harmonic suppression method.

Still another technical problem to be resolved by the present invention is to provide a communication terminal using the harmonic suppression method.

To achieve the foregoing invention objectives, the following technical solutions are used in the present invention:

According to a first aspect of embodiments of the present invention, a harmonic suppression method facing a low-noise amplifier is provided, where an isolation unit is arranged between a harmonic suppression unit of a low-noise amplifier and an output match network/input match network.

Preferably, the isolation unit comprises one or more transistors.

Preferably, the transistor is an NMOS device.

According to a second aspect of the embodiments of the present invention, a low-noise amplifier is provided, where the low-noise amplifier uses the harmonic suppression method, and an isolation unit is arranged between a harmonic suppression unit and an output match network/input match network.

Preferably, the low-noise amplifier further includes an output bias inductor, connected between a power supply and the output match network and configured to provide a direct current bias point to the low-noise amplifier.

Preferably, the low-noise amplifier further includes an amplification unit, where the amplification unit is connected between the input match network and the harmonic suppression unit, one end of the harmonic suppression unit is connected to the amplification unit, the other end of the harmonic suppression unit is connected to the isolation unit, and the isolation unit is connected between the harmonic suppression unit and the output match network.

Preferably, the low-noise amplifier further includes an input bias resistor, where one end of the input bias resistor is connected to a direct current working point control end of the amplification unit, and the other end of the input bias resistor is connected to a direct current bias signal, to implement high-impedance isolation of the direct current bias signal from a radio frequency signal.

Preferably, in the amplification unit, the direct current working point control end and a signal input end are a same end.

Preferably, the harmonic suppression unit has one or more harmonic frequency resonant points expected to be suppressed.

Preferably, the harmonic suppression unit is an LC parallel resonant circuit or an LC series resonant circuit.

Preferably, the low-noise amplifier further includes an isolation unit bias resistor, where one end of the isolation unit bias resistor is connected to a direct current working point control end of the isolation unit, and the other end of the isolation unit bias resistor is connected to a direct current bias signal.

Preferably, the low-noise amplifier further includes a direct current blocking capacitor, where one polar plate of the direct current blocking capacitor is connected to one end of a resonant inductor, and the other polar plate of the direct current blocking capacitor is connected to alternating current ground, so that the direct current blocking capacitor, the resonant inductor, and a parasitic capacitor in the isolation unit form an LC series resonant circuit.

According to a third aspect of the embodiments of the present invention, a communication terminal is provided, the communication terminal including a signal amplification circuit, where the signal amplification circuit uses the low-noise amplifier.

In the harmonic suppression method proposed in the present invention, the harmonic suppression unit is isolated from the output match network/input match network through the isolation unit, and the harmonic suppression unit and the output match network/input match network are not affected or compromised by each other, and can be designed separately. In this way, the design flexibility of a signal amplification circuit is greatly improved, and the design difficulty is reduced.

BRIEF DESCRIPTION OF THE DRAWINGS

FIG. 1 (b) is a circuit principle diagram of a typical output match network/input match network;

DETAILED DESCRIPTION

The technical content of the present invention is further described in detail below with reference to the accompanying drawings and specific embodiments.

It should be noted first that in the embodiments of the present invention, a communication terminal refers to a computer device that can be used in a mobile environment and that supports a plurality of communication standards such as GSM, EDGE, TD-SCDMA, TDD-LTE, and FDD-LTE. The communication terminal includes a mobile phone, a notebook computer, a tablet computer, and an in-vehicle computer. In addition, a low-noise amplifier is also applicable to other scenarios to which signal amplification circuits are applied, for example, a communication base station compatible with a plurality of communication standards.

Figure 1A:
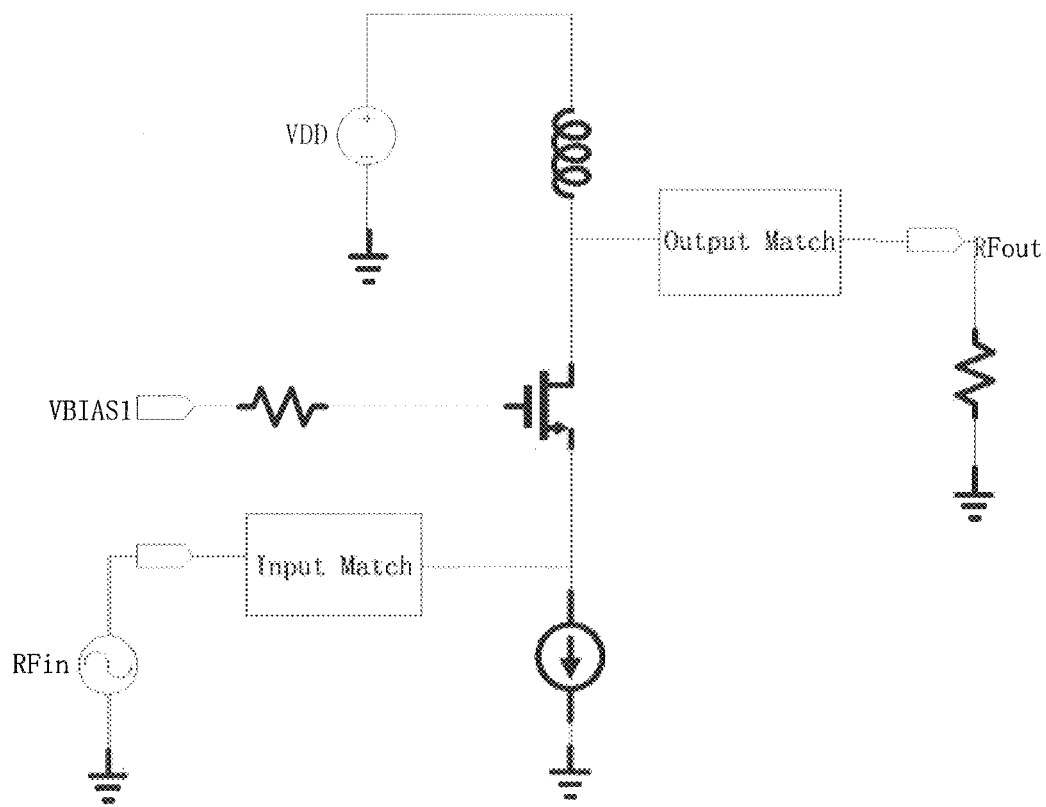
FIG. 1 (a) is a circuit principle diagram of a typical low-noise amplifier.
Figure 1B:
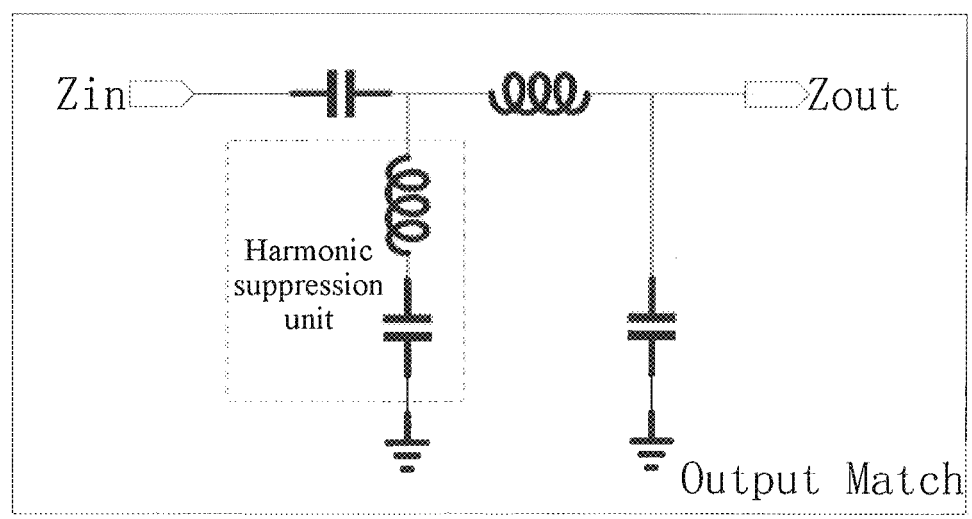

FIG. 1 (a) is a circuit principle diagram of a typical low-noise amplifier. An input match network (InputMatch) and an output match network (OutputMatch) are respectively connected to a drain and a gate of a transistor, and a corresponding bias voltage is applied to a source of the transistor. Low-noise amplification of a radio frequency signal may be implemented through appropriate parameter adjustment. FIG. 1 (b) is a circuit principle diagram of a typical output match network/input match network. A harmonic suppression unit is shown in a dashed box in the figure, shares a device with the match network, and is a component of the output match network/input match network. As stated above, this design manner of inlaying the harmonic suppression unit in the output match network/input match network is a commonly used practice in the prior art and has defects of high difficulty in circuit design and low design flexibility.

For the foregoing defects, the present invention proposes a new harmonic suppression method of a low-noise amplifier, that is, isolating the harmonic suppression unit from the output match network/input match network through the isolation unit. On one hand, a change of an output impedance resulted from the harmonic suppression unit may be avoided, and separate and independent design is implemented. On the other hand, linearity of an output signal of the low-noise amplifier is improved. In a practice, the isolation unit may comprise one or more transistors, which may be transistors of a same type or transistors of different types, such as a combination of an MOS transistor and a BJT transistor. Implementation details of the harmonic suppression method of a low-noise amplifier are specifically described in detail with reference to the following embodiments.

Embodiment 1

Figure 2:
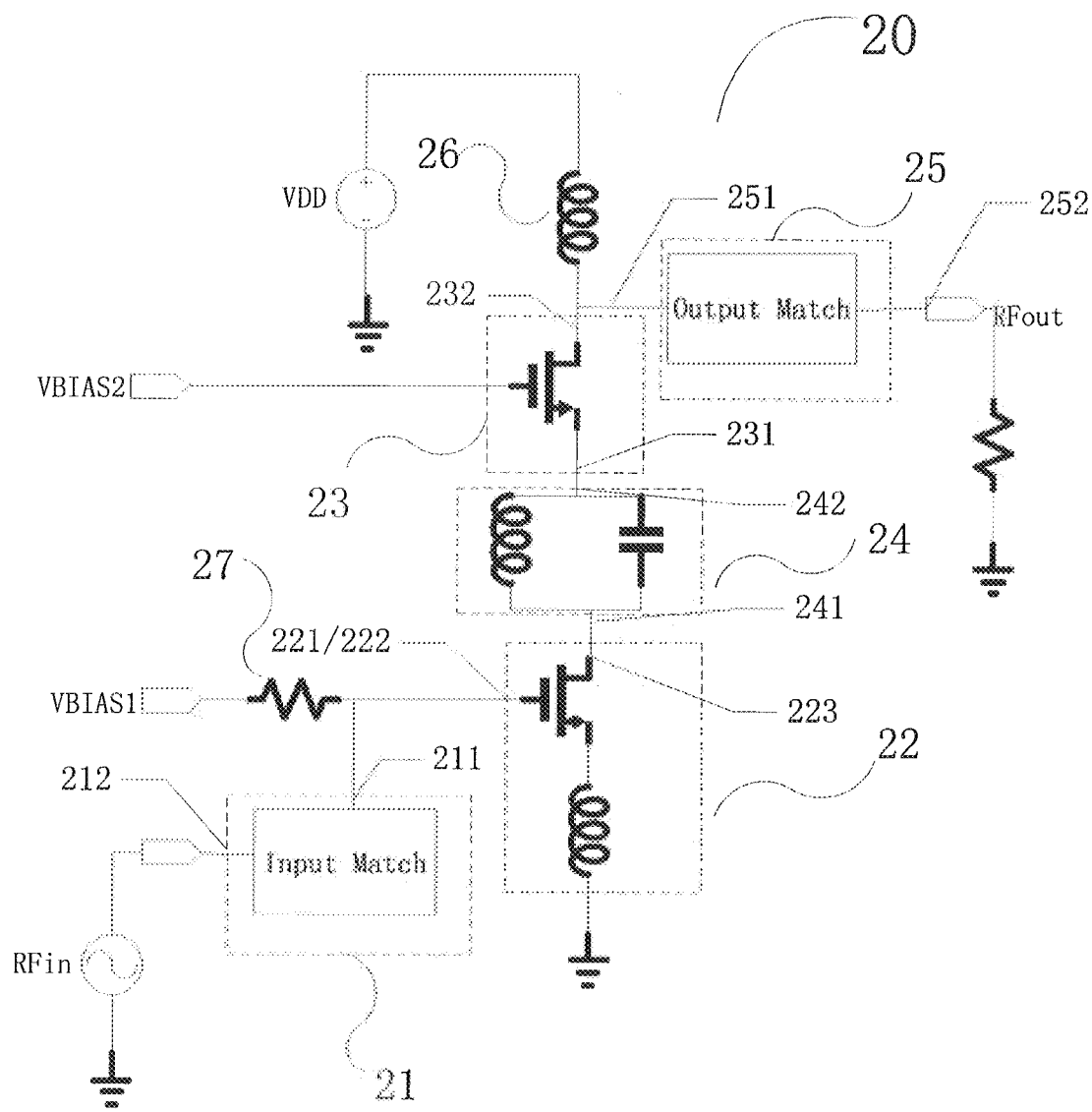
FIG. 2 is a schematic diagram of a first embodiment of a harmonic suppression apparatus according to the present invention.

FIG. 2 is a schematic diagram of a first embodiment of a harmonic suppression apparatus according to the present invention. As shown in FIG. 2, a whole low-noise amplifier 20 includes an input match network 21, an amplification unit 22, an isolation unit 23, a harmonic suppression unit 24, an output match network 25, an output bias inductor 26, and an input bias resistor 27. A radio frequency signal first enters the input match network 21 and then enters a gate of a transistor (including but not limited to an MOS transistor or a triode) in the amplification unit 22. A corresponding first bias voltage VBIAS1 is also input into the gate of the transistor in the amplification unit 22 through the input bias resistor 27. A drain of the transistor in the amplification unit 22 is connected to the harmonic suppression unit 24. The harmonic suppression unit 24 is connected to the output match network 25 through the isolation unit 23. The output match network 25 outputs, to a load device, a radio frequency signal amplified by the amplification unit 22. In addition, the output bias inductor 26 is connected to both the output match network 25 and the isolation unit 23. A second bias voltage VBIAS2 is input into a gate of a transistor in the isolation unit 23.

In the first embodiment, the input match network 21 may be any match network structure that implements impedance conversion, a port 212 of the input match network 21 is connected to an input signal, and a port 211 of the input match network 21 is connected to an input port 221 of the amplification unit 22. Alternatively, the output match network 25 may be any match network structure implementing impedance conversion, a port 251 of the output match network 25 is connected to an output signal of the isolation unit 23, and a port 252 of the output match network 25 is connected to the load device.

The amplification unit 22 may comprise one or more transistors, which may be transistors of a same type or transistors of different types. The input end 221 of the amplification unit 22 is connected to one end 211 of the input match network 21, and a direct current working point control end 222 is connected to the input bias resistor 27. The input end 221 of the amplification unit 22 and the direct current working point control end 222 of the amplification unit 22 may be a same end or may be a plurality of respectively independent ends. An output port 223 of the amplification unit 22 is connected to one end 241 of the harmonic suppression unit 24.

The end 241 of the harmonic suppression unit 24 is connected to the output port 223 of the amplification unit 22, and another end 242 of the harmonic suppression unit 24 is connected to an input end 231 of the isolation unit 23. The harmonic suppression unit 24 is preferably a simple LC parallel resonant circuit, one end of the LC parallel resonant circuit is connected to an output end of the amplification unit, and the other end of the LC parallel resonant circuit is connected to the input end of the isolation unit. A resonant frequency is a harmonic frequency expected to be suppressed. Alternatively, the harmonic suppression unit 24 may be an LC series resonant circuit, one end of the LC series resonant circuit is connected to the output end of the amplification unit and is also connected to the input end of the isolation unit, and the other end of the LC series resonant circuit is connected to alternating current ground. The harmonic suppression unit 24 makes the path present a high impedance at the harmonic frequency and stop a harmonic signal from being transmitted to a next-level device, and present a low impedance at other frequencies and not stop harmonic signals of other frequencies from passing through, to filter a harmonic signal of a particular frequency and improve linearity of the low-noise amplifier. It should be noted that by using different resonant circuit design schemes, the harmonic suppression unit 24 may have one or more harmonic frequency resonant points expected to be suppressed. A specific design of such a resonant circuit is a conventional technical means commonly mastered by a person skilled in the art and is not described in detail herein.

The isolation unit 23 may comprise one or more transistors, which may be transistors of a same type or transistors of different types, such as a combination of an MOS transistor and a BJT transistor. The input end 231 of the isolation unit is connected to the another end 242 of the harmonic suppression unit 24, and an output end 232 of the isolation unit is connected to the output bias inductor 26 and the port 251 of the output match network 25.

One end of the output bias inductor 26 is connected to the output end 232 of the isolation unit 23 and the port 251 of the output match network 25, and the other end of the output bias inductor 26 is connected to a power supply. A function of the output bias inductor 26 is to provide a direct current bias point to the low-noise amplifier 20 and also stops an output alternating current signal, ensuring that an amplification signal is transferred to a next unit without loss.

One end of the input bias resistor 27 is connected to the direct current working point control end 222 of the amplification unit 22, and the other end of the input bias resistor 27 is connected to a direct current bias signal. A function of the input bias resistor 27 is to implement high-impedance isolation of the direct current bias signal from the radio frequency signal and prevent an alternating current signal from being leaked to the alternating current ground.

Embodiment 2

Figure 3:
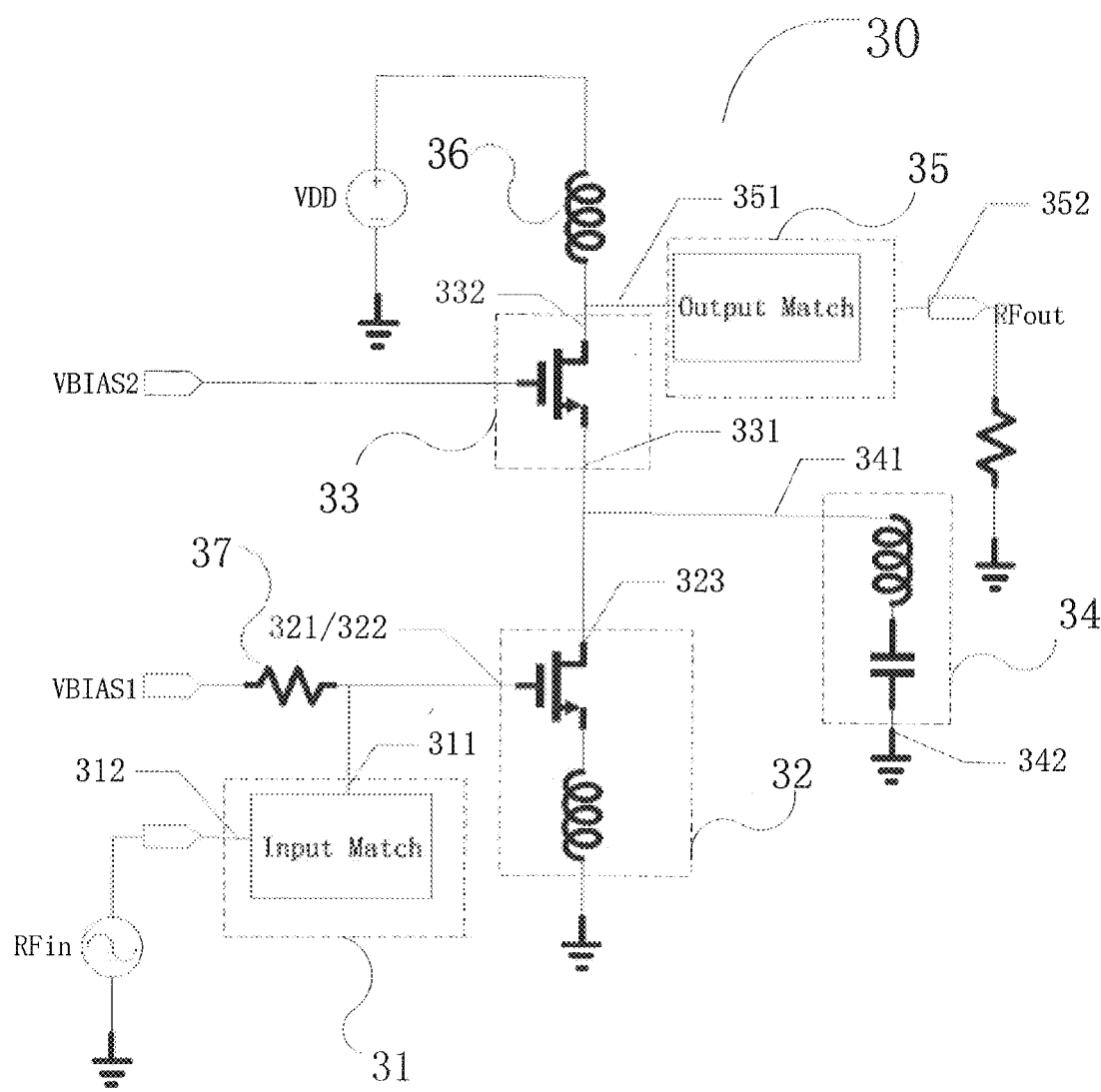
FIG. 3 is a schematic diagram of a second embodiment of a harmonic suppression apparatus according to the present invention.

FIG. 3 is a schematic diagram of a second embodiment of a harmonic suppression apparatus according to the present invention. As shown in FIG. 3, a whole low-noise amplifier 30 includes an input match network 31, an amplification unit 32, an isolation unit 33, a harmonic suppression unit 34, an output match network 35, an output bias inductor 36, and an input bias resistor 37. A radio frequency signal first enters the input match network 31, and then enters a source of a transistor in the amplification unit 32. A corresponding first bias voltage VBIAS1 is also input into a gate of the transistor in the amplification unit 32 through the input bias resistor 37. A drain of the transistor in the amplification unit 32 is connected to the isolation unit 33 and is connected to the harmonic suppression unit 34. The other end of the harmonic suppression unit 34 is directly grounded. The isolation unit 33 is connected to the output match network 35. The output match network 35 outputs, to a load device, a radio frequency signal amplified by the amplification unit 32. In addition, the output bias inductor 36 is connected to both the output match network 35 and the isolation unit 33. A second bias voltage VBIAS2 is input into a gate of a transistor in the isolation unit 33.

In the second embodiment, the input match network 31 may be any match network structure that implements impedance conversion, a port 312 of the input match network 31 is connected to an input radio frequency signal, and a port 311 of the input match network 31 is connected to an input port 321 of the amplification unit 32. Likewise, the output match network 35 may be any match network structure implementing impedance conversion, a port 351 of the output match network 35 is connected to an output signal of the isolation unit 33, and a port 352 of the output match network 35 is connected to the load device.

The amplification unit 32 may comprise one or more transistors, which may be transistors of a same type or transistors of different types. The input end 321 of the amplification unit 32 is connected to one end 311 of the input match network 31, and a direct current working point control end 322 is connected to the input bias resistor 37. The input end 321 of the amplification unit 32 and the direct current working point control end 322 of the amplification unit 32 may be a same end or may be a plurality of respectively independent ends. An output port 323 of the amplification unit 32 is connected to one end 341 of the harmonic suppression unit 34.

The end 341 of the harmonic suppression unit 34 is connected to the output port 323 of the amplification unit 32, and the other end of the harmonic suppression unit 34 is connected to alternating current ground 342. The harmonic suppression unit 34 is preferably a simple LC series resonant circuit but is not limited thereto. A resonant frequency of the harmonic suppression unit 34 is a harmonic frequency expected to be suppressed. The harmonic suppression unit 34 makes the path present a low impedance for the alternating current ground at the harmonic frequency and make the harmonic signal flow to the alternating current ground and not transmitted to a next-level device, and present a high impedance for the alternating current ground at other frequencies and thus not affect signals of other frequencies passing by on the path, to filter a harmonic signal of a particular frequency and improve linearity of the low-noise amplifier. It should be noted that by using different resonant circuit design schemes, the harmonic suppression unit 34 may have one or more harmonic frequency resonant points expected to be suppressed. A specific design of such a resonant circuit is a conventional technical means commonly mastered by a person skilled in the art and is not described in detail herein.

The isolation unit 33 may comprise one or more transistors, which may be transistors of a same type or transistors of different types, such as a combination of an MOS transistor and a BJT transistor. An input end 331 of the isolation unit is connected to the a port 341 of the harmonic suppression unit 34, and an output end 332 of the isolation unit is connected to the output bias inductor 36 and the port 351 of the output match network 35.

One end of the output bias inductor 36 is connected to the output end 332 of the isolation unit 33 and the port 351 of the output match network 35, and the other end of the output bias inductor 36 is connected to a power supply. The output bias inductor 36 provides a direct current bias point to the low-noise amplifier 30 and also stops an output alternating current signal, ensuring that an amplification signal is transferred to a next unit without loss.

One end of the input bias resistor 37 is connected to the direct current working point control end 322 of the amplification unit 32, and the other end of the input bias resistor 37 is connected to a direct current bias signal. A function of the input bias resistor 37 is to implement high-impedance isolation of the direct current bias signal from the radio frequency signal and prevent an alternating current signal from being leaked to the alternating current ground.

Embodiment 3

Figure 4:
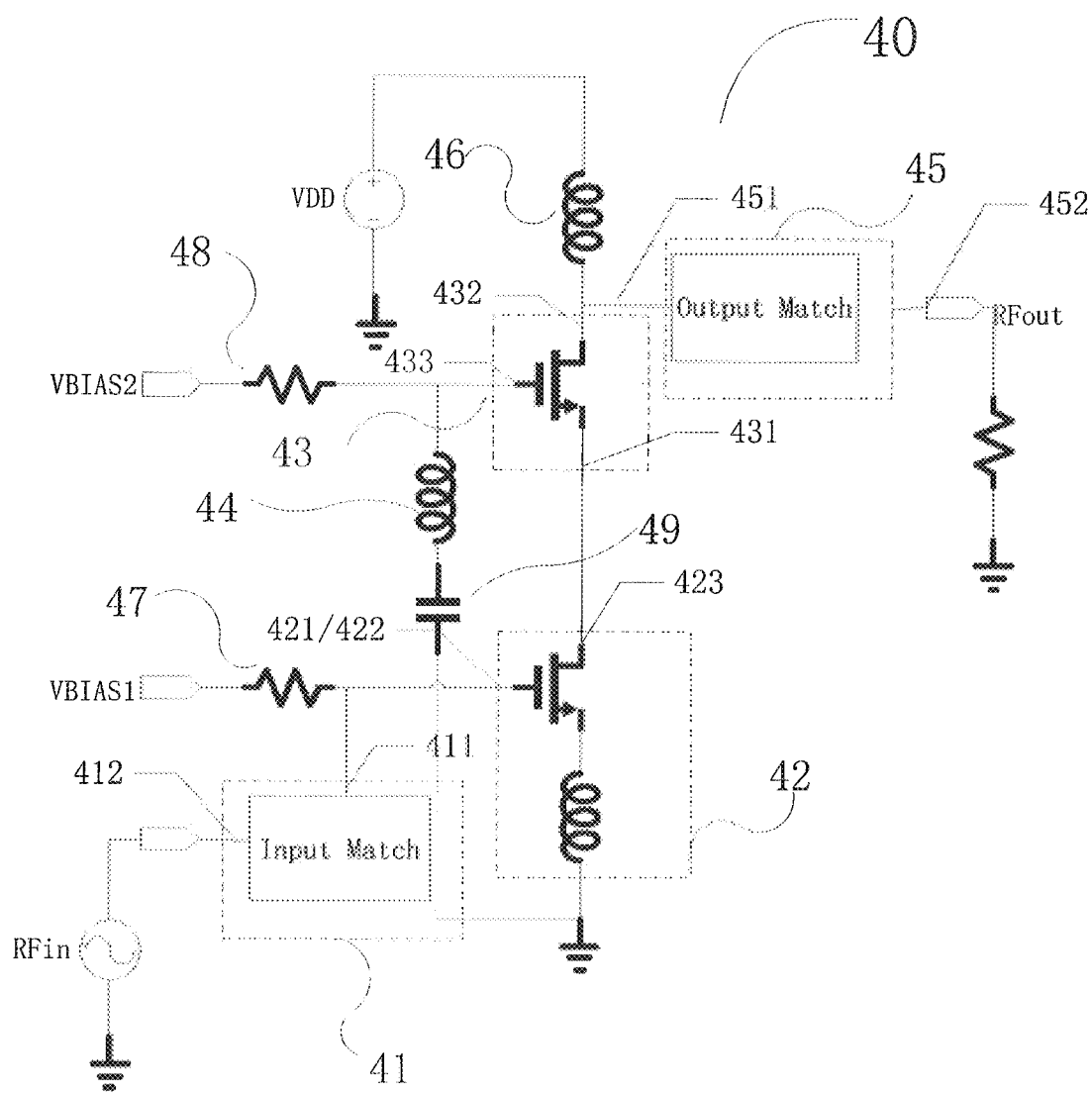
FIG. 4 is a schematic diagram of a third embodiment of a harmonic suppression apparatus according to the present invention.

FIG. 4 is a schematic diagram of a third embodiment of a harmonic suppression apparatus according to the present invention. As shown in FIG. 4, a whole low-noise amplifier 40 includes an input match network 41, an amplification unit 42, an isolation unit 43, a resonant inductor 44, an output match network 45, an output bias inductor 46, an input bias resistor 47, an isolation unit bias resistor 48, and a direct current blocking capacitor 49. A radio frequency signal first enters the input match network 41, and then enters a gate of a transistor in the amplification unit 42. A corresponding first bias voltage VBIAS1 is also input into the gate of the transistor in the amplification unit 42 through the input bias resistor 47. A drain of the transistor in the amplification unit 42 is connected to the isolation unit 43. One end of the resonant inductor 44 is connected to a gate (that is, a control end of the isolation unit) of a transistor in the isolation unit 43, and the other end of the resonant inductor 44 is connected to the direct current blocking capacitor 49. A second bias voltage VBIAS2 is also input into the gate of the transistor in the isolation unit 43. On the other hand, the isolation unit 43 is connected to the output match network 45. The output match network 45 outputs, to a load device, a radio frequency signal amplified by the amplification unit 42. In addition, the output bias inductor 46 is connected to both the output match network 45 and the isolation unit 43.

In the third embodiment, the input match network 41 may be any match network structure that implements impedance conversion, a port 412 of the input match network 41 is connected to an input radio frequency signal, and a port 411 of the input match network 41 is connected to an input port 421 of the amplification unit 42. Likewise, the output match network 45 may be any match network structure implementing impedance conversion, a port 451 of the output match network 45 is connected to an output signal of the isolation unit 43, and a port 452 of the output match network 45 is connected to the load device.

The amplification unit 42 may comprise one or more transistors, which may be transistors of a same type or transistors of different types. The input end 421 of the amplification unit 42 is connected to one end 411 of the input match network 41, and a direct current working point control end 422 is connected to the input bias resistor 47. The input end 421 of the amplification unit 42 and the direct current working point control end 422 of the amplification unit 42 may be a same end or may be a plurality of respectively independent ends. An output port 423 of the amplification unit 42 is connected to an input end 431 of the isolation unit 43.

In the third embodiment, the isolation unit 43 is preferably an NMOS device. The isolation unit 43 may comprise one or more transistors, which may be transistors of a same type or transistors of different types, such as a combination of an MOS transistor and a BJT transistor. The input end 431 of the isolation unit is connected to the port 423 of the amplification unit 42, an output end 432 of the isolation unit is connected to the output bias inductor 46 and the port 451 of the output match network 45, and the direct current working point control end 433 of the isolation unit is connected to the isolation unit bias resistor 48 and is also connected to one end of the resonant inductor 44.

The end of the resonant inductor 44 is connected to the control end 433 of the isolation unit, and the other end of the resonant inductor 44 is connected to one polar plate of the direct current blocking capacitor 49. The other polar plate of the direct current blocking capacitor 49 is grounded to form an alternating current path. In the third embodiment, a parasitic capacitor from the port 431 to the port 433 of the isolation unit 43, the resonant inductor 44, and the direct current blocking capacitor 49 are used to form an LC series resonant circuit, to implement a complete harmonic suppression unit. A resonant frequency of the harmonic suppression unit is a harmonic frequency expected to be suppressed, so that the path presents a low impedance for the alternating current ground at the harmonic frequency and the harmonic signal flows to the alternating current ground and is not transmitted to a next-level device, and the path presents a high impedance for the alternating current ground at other frequencies and does not affect signals of other frequencies passing by on the path, to filter a harmonic signal of a particular frequency and improve linearity of the low-noise amplifier. It should be noted that by using different resonant circuit design schemes, the harmonic suppression unit may have one or more harmonic frequency resonant points expected to be suppressed. A specific design of such a resonant circuit is a conventional technical means commonly mastered by a person skilled in the art and is not described in detail herein.

One end of the output bias inductor 46 is connected to the output end 432 of the isolation unit and the output match network 451, and the other end of the output bias inductor 46 is connected to a power supply. The output bias inductor 46 provides a direct current bias point to the low-noise amplifier 40 and also stops an output alternating current signal, ensuring that an amplification signal is transferred to a next unit without loss.

One end of the input bias resistor 47 is connected to the direct current working point control end 422 of the amplification unit 42, and the other end of the input bias resistor 47 is connected to a direct current bias signal, which functions to prevent an alternating current signal from being leaked to the alternating current ground. One end of the isolation unit bias resistor 48 is connected to the direct current working point control end 433 of the isolation unit 43, and the other end of the isolation unit bias resistor 48 is connected to a direct current bias signal, which also functions to prevent an alternating current signal from being leaked to the alternating current ground.

As stated above, in the third embodiment, one polar plate of the direct current blocking capacitor 49 is connected to one end of the resonant inductor 44, and the other polar plate is connected to the alternating current ground. On one hand, the direct current blocking capacitor 49, the resonant inductor 44, and the parasitic capacitor from the port 431 to the port 433 of the isolation unit 43 form an LC series resonant circuit. On the other hand, it is ensured that the port 433 of the isolation unit 43 does not have a direct current path connected to ground, ensuring normal operation of the direct current working point.

The low-noise amplifier using the harmonic suppression method described in the foregoing embodiments may be used in an integrated circuit chip to implement a preamplification function of a high-frequency or an intermediate-frequency signal. A structure of the low-noise amplifier in the chip is not described in detail herein.

Figure 5:
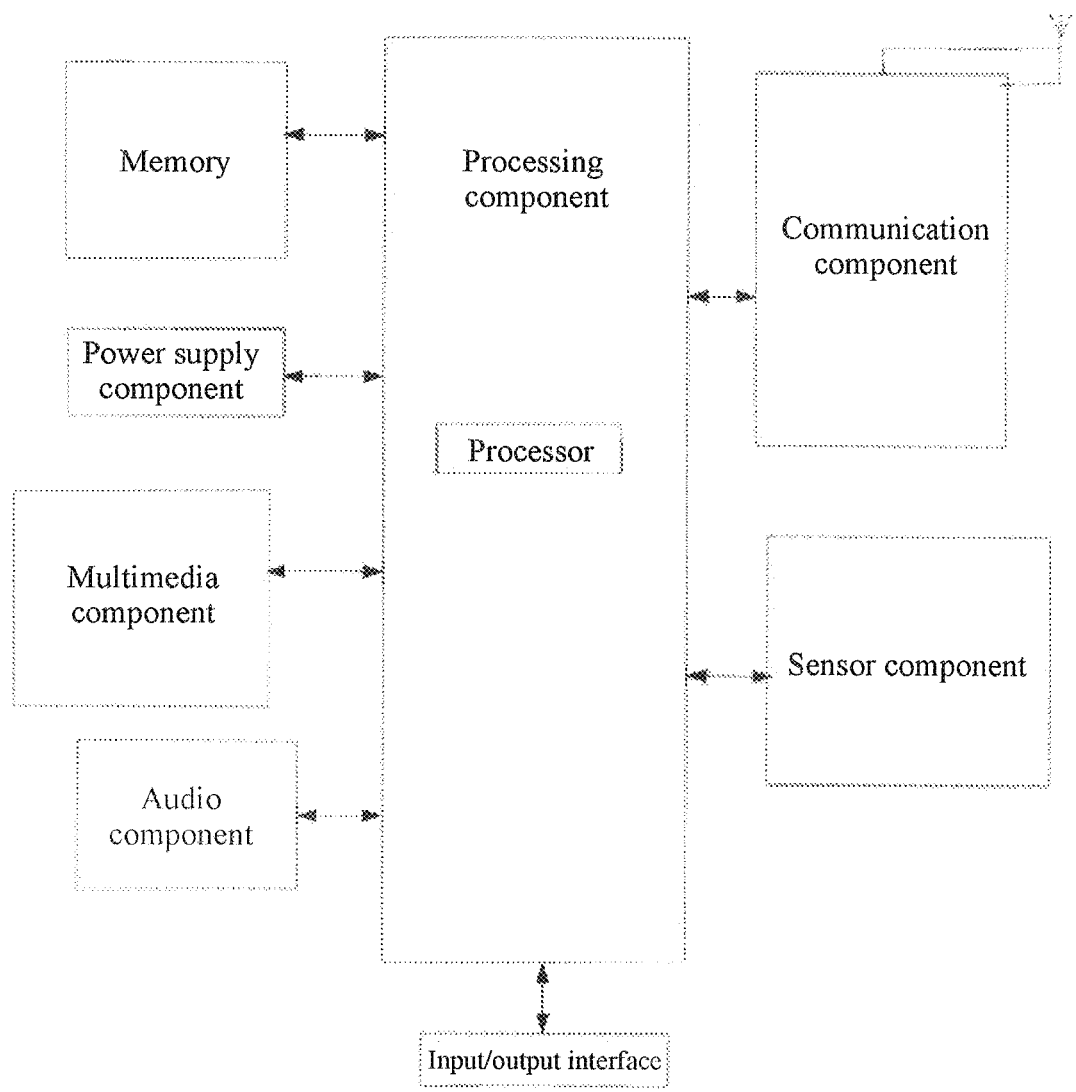
FIG. 5 is a block diagram of a communication terminal according to an exemplary embodiment.

In addition, the low-noise amplifier may also be used in a communication terminal as an important component of a signal amplification circuit. FIG. 5 is a block diagram of a communication terminal according to an exemplary embodiment. The communication terminal described herein may refer to a computer device that can be used in a mobile environment and that supports a plurality of communication standards such as GSM, EDGE, TD-SCDMA, TDD-LTE, and FDD-LTE. The communication terminal includes but is not limited to a mobile phone, a notebook computer, a tablet computer, and an in-vehicle computer. Referring to FIG. 5, the communication terminal may include one or more of the following components: a processing component, a memory, a power supply component, a multimedia component, an audio component, an input/output (I/O) interface, a sensor component, and a communication component. These components use a signal amplification circuit including the foregoing low-noise amplifier.

The processing component usually controls overall operations of the apparatus, such as operations associated with display, telephone calls, data communication, camera operations, and recording operations. The processing component may include one or more processors to execute instructions, to perform all of or some of steps of the foregoing method. In addition, the processing component may include one or more modules, to facilitate interaction between the processing component and other components. For example, the processing component may include a multimedia module, to facilitate interaction between the multimedia component and the processing component.

The memory is configured to store various types of data to support an operation on the communication terminal. Examples of such data include instructions for any application or method operated on the communication terminal, contact data, phonebook data, messages, pictures, videos, and the like. The memory may be implemented by any type of volatile or non-volatile storage devices or a combination thereof, such as a static random access memory (SRAM), an electrically erasable programmable read-only memory (EE-PROM), an erasable programmable read-only memory (EPROM), a programmable read-only memory (PROM), a read-only memory (ROM), a magnetic memory, a flash memory, a magnetic disk, or an optical disc.

A power supply component provides power to various components of the communication terminal. The power supply component may include a power management system, one or more power supplies, and other components associated with generation, management, and distribution of electric power in the communication terminal.

The multimedia component includes a screen providing an output interface between the communication terminal and a user. In some embodiments, the screen may include a liquid crystal display (LCD) and a touch panel (TP). If the screen includes the touch panel, the screen may be implemented as a touch screen, to receive an input signal from the user. The touch panel includes one or more touch sensors to sense touches and swipes, and gestures on the touch panel. The touch sensor may not only sense a boundary of a touch or swipe action but also detect a period of time and a pressure associated with the touch or swipe action. In some embodiments, the multimedia component includes a front-facing camera and/or a rear-facing camera. When the communication terminal is in an operation mode, such as a photographing mode or a video mode, the front-facing camera and/or the rear-facing camera may receive external multimedia data. Each of the front-facing camera and the rear-facing camera may be a fixed optical lens system or have a focus length and an optical zoom capability.

The audio component is configured to output and/or input an audio signal. For example, the audio component includes a microphone (MIC). When the communication terminal is in an operation mode, such as a call mode, a recording mode, and a voice recognition mode, the microphone is configured to receive an external audio signal. The received audio signal may be further stored in the memory or sent via the communication component. In some embodiments, the audio component further includes a speaker, configured to output the audio signal.

The I/O interface provides an interface between the processing component and a peripheral interface module. The peripheral interface module may be a keyboard, a click wheel, buttons, and the like. The buttons include but are not limited to: a home page button, a volume button, a starting button, and a locking button.

The sensor component includes one or more sensors, configured to provide state assessments of various aspects of the communication terminal. For example, the sensor component may detect an open/closed state of the communication terminal, relative positioning of components. For example, the components may be a display and a keypad of the communication terminal. The sensor component may further detect a change in position of the communication terminal or a component of the communication terminal, presence or absence of contact between the user and the communication terminal, an orientation or an acceleration/deceleration of the communication terminal, and a change in temperature of the communication terminal. The sensor component may include a proximity sensor, configured to detect presence of nearby objects without any physical contact. The sensor component may further include an optical sensor, such as a CMOS or CCD image sensor, for use in imaging applications. In some embodiments, the sensor component may further include an acceleration sensor, a gyroscope sensor, a magnetic sensor, a pressure sensor, or a temperature sensor.

The communication component is configured to facilitate wired or wireless communication between the communication terminal and other devices. The terminal device can access a wireless network based on a communication standard, such as WiFi, 2G, or 3G, or a combination thereof. In one exemplary embodiment, the communication component receives a broadcast signal or broadcast related information from an external broadcast management system via a broadcast channel. In one exemplary embodiment, the communication component further includes a near field communication (NFC) module to facilitate short-range communication. For example, the NFC module may be implemented based on a radio frequency identification (RFID) technology, an infrared data association (IrDA) technology, an ultra-wideband (UWB) technology, a Bluetooth (BT) technology, and other technologies.

The harmonic suppression method, corresponding low-noise amplifier and communication terminal provided in the present invention are described in detail above. For a person of ordinary skill in the art, any obvious change made under the premise of not departing from the substantial spirit of the present invention shall construct violation to the patent right of the present invention and bear a corresponding legal responsibility.

What is claimed is:

1. A low-noise amplifier, wherein an isolation unit is arranged between a harmonic suppression unit and an output match network/input match network, the isolation unit comprises one or more transistors;

the low-noise amplifier further comprising an input bias resistor and an output bias inductor;

wherein one end of the input bias resistor is connected to a direct current working point control end of the amplification unit, and the other end of the input bias resistor is connected to a direct current bias signal, to implement high-impedance isolation of the direct current bias signal from a radio frequency signal; and the output bias inductor is connected between a power supply and the output match network and configured to provide a direct current bias point to the low-noise amplifier.

2. The low-noise amplifier according to claim 1, further comprising an amplification unit, wherein the amplification unit is connected between the input match network and the harmonic suppression unit, one end of the harmonic suppression unit is connected to the amplification unit, the other end of the harmonic suppression unit is connected to the isolation unit, and the isolation unit is connected between the harmonic suppression unit and the output match network.

3. The low-noise amplifier according to claim 1, wherein in the amplification unit, the direct current working point control end and a signal input end are a same end.

4. The low-noise amplifier according to claim 1, wherein the harmonic suppression unit has one or more harmonic frequency resonant points expected to be suppressed.

5. The low-noise amplifier according to claim 1, wherein the harmonic suppression unit is an LC parallel resonant circuit, one end of the LC parallel resonant circuit is connected to an output end of the amplification unit, and the other end of the LC parallel resonant circuit is connected to an input end of the isolation unit.

6. The low-noise amplifier according to claim 1, further comprising an isolation unit bias resistor, wherein one end of the isolation unit bias resistor is connected to a direct current working point control end of the isolation unit, and the other end of the isolation unit bias resistor is connected to a direct current bias signal.

7. The low-noise amplifier according to claim 1, further comprising a direct current blocking capacitor, wherein one polar plate of the direct current blocking capacitor is connected to one end of a resonant inductor, the other polar plate of the direct current blocking capacitor is connected to alternating current ground, and the other end of the resonant inductor is connected to a control end of the isolation unit, so that the direct current blocking capacitor, the resonant inductor, and a parasitic capacitor in the isolation unit form an LC series resonant circuit.

8. The low-noise amplifier according to claim 1, wherein the harmonic suppression unit is an LC series resonant circuit, one end of the LC series resonant circuit is connected to an output end of the amplification unit and is connected to an input end of the isolation unit, and the other end of the LC series resonant circuit is connected to alternating current ground.

9. A communication terminal, comprising a signal amplification circuit, wherein the signal amplification circuit uses the low-noise amplifier according to claim 1.

* * * * *